United States Patent [19]

Moeller

[11] 4,218,658

[45] Aug. 19, 1980

[54] NON-CONTEMPORANEOUS LOGIC ELEMENT AND METHOD FOR SYNTHESIZING A CONDITION WHICH REPRESENTS A SEQUENCE

[76] Inventor: Charles R. Moeller, 2133 Oxford Ave., Cardiff-by-the-Sea, Calif. 92007

[21] Appl. No.: 843,159

[22] Filed: Oct. 17, 1977

[51] Int. Cl.$^2$ .......................... H03K 5/00; H03K 5/18
[52] U.S. Cl. .................................. 328/109; 307/232; 328/97; 307/210
[58] Field of Search .................. 307/210, 232; 328/93, 328/97, 109, 110, 119, 92

[56] References Cited
U.S. PATENT DOCUMENTS

| | | | |
|---|---|---|---|
| 3,206,683 | 9/1965 | Davis et al. | 307/232 X |
| 3,399,351 | 8/1968 | Reszka | 307/232 X |
| 3,553,489 | 1/1971 | Spencer et al. | 307/232 |
| 3,860,832 | 1/1975 | Aapro | 307/232 |

*Primary Examiner*—John Zazworsky

[57] ABSTRACT

A logic element which provides a unique output for each unique, non-contemporaneous, non-repetitive sequence of input signals; and a method of synthesis of non-contemporaneous, non-repetitive sequences according to the temporal order of the input signals.

3 Claims, 8 Drawing Figures

NON-CONTEMPORANEOUS LOGIC ELEMENT AND METHOD FOR SYNTHESIZING A CONDITION WHICH REPRESENTS A SEQUENCE

BACKGROUND OF THE INVENTION

1. Field of the Invention

This invention relates to logic elements in general, and to a non-contemporaneous logic element in particular. Contemporaneous, i.e. combinational, logic elements are widely applied in fields such as computation and machine control. Sequential logic elements are similarly applied, and they are combinations of contemporaneous logic elements which, generally, are stepped through their paces by means of clock pulses.

This invention identifies one of a new class of logic elements which are responsive to non-contemporaneous input signals; and a method of synthesizing conditions corresponding to such temporal sequences.

2. Description Relative to the Prior Art

The definitions of combinational, i.e. contemporaneous, logic elements; and sequential logic elements are given in the *IEEE Standard Dictionary of Electrical and Electronics Terms,* 1972, Wiley-Intersciences:

(A) Combinational Logic Element: 1. a device having zero or more input channels and one output channel, each of which is always in one of exactly two possible physical states, except during switching transients. The output channel state is determined completely by the contemporaneous input channel state combination (to within switching transients).

(B) Sequential Logic Element: a device having at least one output channel and one or more input channels, all characterized by discrete states, such that the state of each output channel is determined by the previous states of the input channels.

The combinational logic elements provide outputs coexistent with the input signals (neglecting propagation delays), while the sequential logic elements provide outputs at the next clock pulse, according to inputs present during the preceding clock pulse.

In the fields of computation and machine control, there are certain instances when it is useful and necessary to have a logic element which provides a unique output in response to a non-contemporaneous, non-repetitive series of diverse input signals, i.e., a specified sequence.

In a particular application, for example, suppose it is necessary to ascertain in which order two sensors are activated, i.e., for two sensors "A" and "B", whether the sequence was "A" first, then "B", or the opposing order, "B" first, then "A". The application in an instance may be to implement an exercise in statistical analysis in which a given likely sequence is tabulated during a number of trials to determine its frequency.

Another application may be the determination, through fluidic sensors and logic elements, of the order in which two parts were installed on an assembly line.

Yet another application may be to perform a temporal decision test within a computer by means of an on-board, integrated circuit, implementing such statements as: "IF A BEFORE B THEN GO TO 235".

A logic element which can perform such tasks has not been readily available in the field, nor has such a class of logic elements been designated or defined.

SUMMARY OF THE INVENTION

In order to fill that void, the following definition is hereby announced: A non-contemporaneous logic element is a device having one or more input channels for the reception of non-contemporaneous input signals; and one or more output channels having discrete states which are determined by the temporal order, or sequnce, in which the input signals are received. The topic revealed in this definition which is characteristic of non-contemporaneous logic elements, is that of sequence and sequences.

All sequences are comprised of a series of things or events, each of which can be directly related to its closest neighbor(s). Any sequence can be exactly described by listing all the pairs of neighboring items with their temporal relationship. For example, if all the pairs and their relations in a particular sequence are: (1) "C before D", (2) "D before B", and (3) "B before A", then the 4 item sequence: "C,D,B,A" has been exactly described according to the temporal order of the items in the sequence.

For any pair "A,B" of non-contemporaneous events, there are only two possible sequences: "first A, then B"; or "first B, then A". The present invention provides logic elements which synthesize conditions corresponding to the temporal order of pairs of signals in a non-contemporaneous, non-repetitive sequence; and describes a method of logically combining those conditions, thus synthesizing a condition which corresponds to the complete sequence.

The logic elements described herein are compounded of storage means and combinational logic elements. The storage means may be a storage device of any type compatible with the system in which it is to be used, and consistent with design constraints and goals.

The logic elements, and combinations of such as will be shown, may be implemented with mechanical, electrical, fluidic, electronic, etc., components depending upon the use intended. The novel logic elements may be constructed to be slow, medium, or high speed, again depending upon the use intended.

The invention will be further described with reference to the Figures, wherein:

FIGS. 1, 2, and 4 are block diagrams useful in describing the invention,

The conventions which are adopted throughout this disclosure are: (1) Positive logic: an activated inputs is +, and an activated output is +; (2) Energized=activated= + =on; (3) De-energized=deactivated=0=-off. Note that other conventions and corresponding implementations could have been used.

Figure 1:
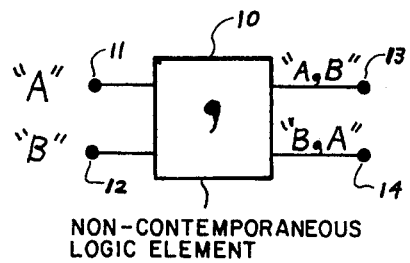

According to the invention, a block diagram, FIG. 1, shows the basic logic element 10 with input terminals 11 and 12, and output terminals 13 and 14. When an acceptable signal "A" is presented to input terminal 11, followed by a subsequent signal "B", presented to input terminal 12; output terminal 13 will deliver an output signal "+", while output terminal 14 will remain at 0. Conversely, when a signal "B" is presented to input terminal 12, followed by a subsequent signal "A", presented to input terminal 11; output terminal 14 will deliver an output signal "+", while output terminal 13 will remain at 0.

The temporal order of the variables "A", "B", "C", etc., will be represented in natural sequence, left-to-right, and each separated by a comma. If the temporal order is: "B before C, then C before A, then A before D", the sequence will be stated: "B,C,A,D". An output terminal will be designated with the temporal order of the sequence it represents when activated.

Figure 2:
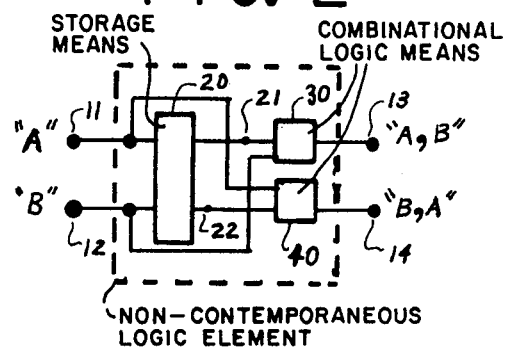

FIG. 2 shows an arrangement of logic element 10, which is comprised of a storage means, 20, and combinational logic means 30 and 40. When either input channel 11 or 12 is activated with a suitable input signal, storage means 20 stores that data. When the alternate input channel is subsequently activated, that signal, together with the stored data, which is then available at either storage output terminal 21 or 22, activates combinational logic means 30 or 40, producing an output signal at 13 or 14. As an example, say that a first input signal "A", is presented to input 11. Storage means 20 stores the information that 11 was activated first. Then, say, a subsequent signal "B", is presented to input 12. The signal at 12 may or may not be stored in storage means 20, but the said signal does activate combinational logic means 30, together with an output present at 21; thus producing an output signal at 13. The storage means 20 may be arranged to produce an output as soon as an input is stored, or it may be arranged to produce an output at a later time.

The storage means need not be located in close proximity to the other parts of the logic element 10, unless the storage delay time and subsequent retrieval delay time would adversely affect the operation or implementation of the said logic element in a particular system or sub-system of instrumentation, control, or computation.

Figure 3:
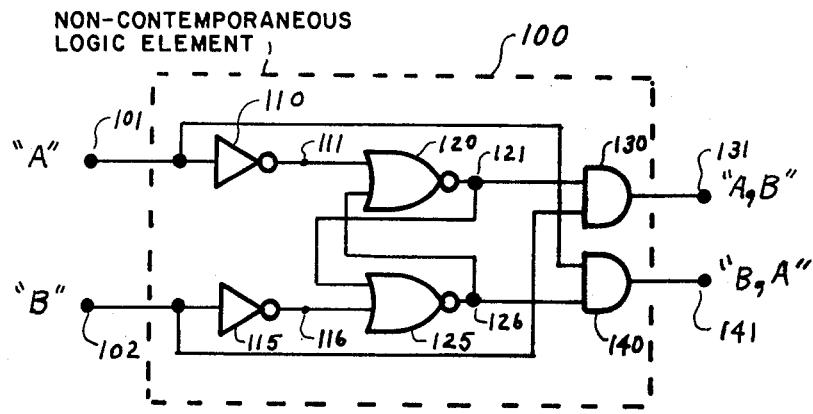
FIGS. 3 and 5 are schematic diagrams of embodiments of the invention.

In FIG. 3 is shown a particular embodiment of the invention, in which logic element 100 is comprised of two inverters, 110 and 115; two NOR gates, 120 and 125; two AND gates, 130 and 140; two input terminals, 101 and 102; two output terminals, 131 and 141; and interconnections as shown. Elements 120–125 comprise a bilateral storage element.

This embodiment is one adapted to accept, as inputs, the non-contemporaneous inception of signals."A" and "B", representing events, that rise from zero (0) to a plus (+) level, and are thereafter maintained at +, as due to switch closures. Initially, both input terminals 101 and 102 are at 0. A 0 into 110 makes 111 a +, and a 0 into 115 makes 116 a +. A + into 120 makes 121 a 0, and a + into 125 makes 126 a 0. Zeros into both inputs of 130 and 140 result in 131 and 141 at 0.

Suppose a first input signal "A", a +, is presented to input terminal 101, while input terminal 102 remains at 0. A + into 110 makes 111 a 0, while 166, a +, into 125, keeps 126 at 0. Both 126 and 111 at 0 into 120, makes 121 a +, into 125, latching 126 at 0. 121, a +, and 102, a 0, into 130, results in 0 at 131, as previously. 101, a +, and 126, a 0, into 140, results in 0 at 141, as previously. Now, while the first input signal to 101 is maintained at +, an input signal "B" is presented to 102, making 102 a +. A + into 115 makes 116 a 0, which, with 121, a +, into 125, does not change 126, at 0. 102, a +, into 130, together with 121, a +, results in output 131, a +. 101, a +, and 126, a 0, into 140, maintains output 141 at 0. Thus, for the input signals described occurring in the order "A first, then B", output 131 is activated.

Since the logic element 100 is symmetrically arranged and connected, the reverse input signal sequence: "B first, then A", starting from the initial condition, will result in an output signal at 141, a +, while 131 remains at 0.

Figure 4:
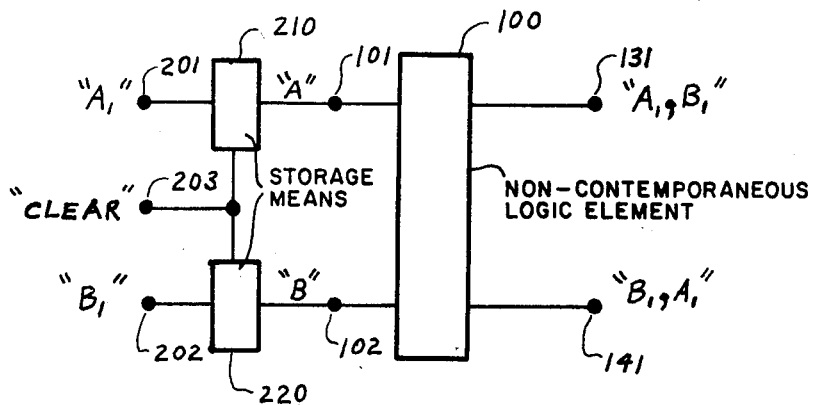

An embodiment of the invention adapted to operate when presented with momentary + input signals is shown in FIG. 4.

FIG. 4 shows a logic element comprised of 2 storage means, 210 and 220, having inputs 201 and 202, and outputs 101 and 102 which are, in turn, inputs for the logic element 100 as previously described, which has outputs 131 and 141. Clear terminal 203 is connected to the storage means 210 and 220.

Each of the storage means, 210 and 220, are arranged so that a momentary input signal or pulse, causes a corresponding permanently stored condition to persist, and said condition provides an output signal signifying its presence. Previously stored input signals may be cleared by an appropriate signal.

The normal, or quiescent, condition of each input, 201 and 202, is 0. After having been cleared by means of a "CLEAR" signal presented to clear terminal 203, the logic element of FIG. 4 is ready to accept input signals "$A_1$" and "$B_1$", which will be short duration + pulses. Then, when a signal, "$A_1$", is presented to storage means 210 at input 201, 210 stores that input and presents a maintained output "A", to terminal 101. The input, "$A_1$", at 201, may then return to 0 without loss of the information of its occurrence. A subsequent input, "$B_1$", at input 202 of storage element 220, causes the storage of that input and presents a maintained output, "B", to terminal 102. The input, "$B_1$", at 202 may then return to 0 without loss of the information of its occurrence.

An input "A", on 101, followed by an input, "B", on 102 of logic element 100 results in a + output on 131, with 141 remaining 0, as previously described. In a similar fashion, if storage elements 210 and 220 were cleared, and a signal "$B_1$", presented to input 202, followed by a subsequent signal, "$A_1$", presented to input 201, an output, "B", would appear at 102, followed by an output "A", appearing at 101.

Now, a "B,A" appearing on inputs 102 and 101 of logic element 100, results in a + output on 141, with 131 remaining at 0, as previously described. Thus for non-contemporaneous momentary signals, "$A_1$" followed by "$B_1$" (after a "CLEAR" signal), output 131 is energized, while for a "$B_1$" followed by an "$A_1$" (after a "CLEAR" signal), output 141 is energized. In either case, the alternate output remains at 0.

Figure 5:
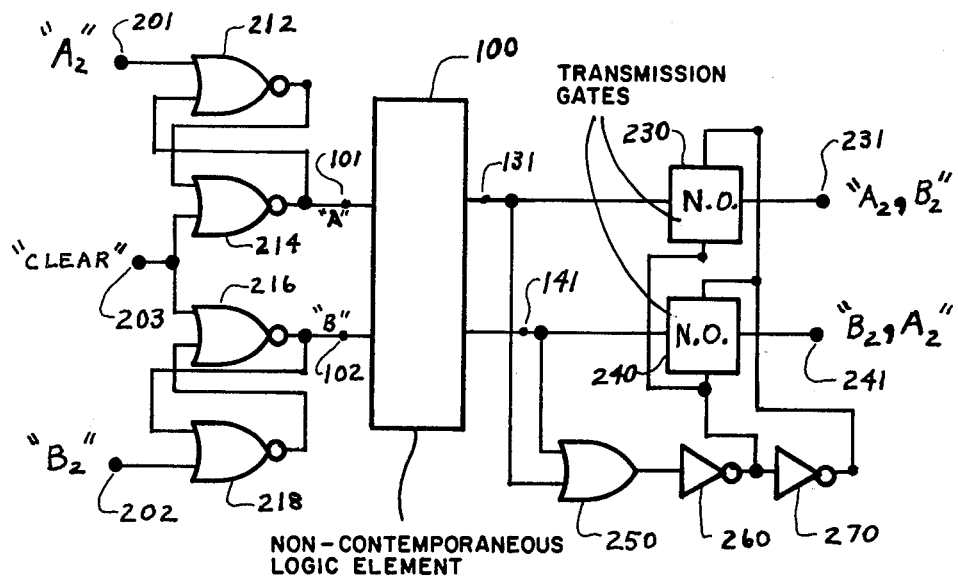

FIG. 5 depicts a logic element of the same type in which the storage means 210 and 220 are constructed of interconnected NOR gates 212 and 214, and 216 and 218, which form bistable storage elements. With no input signals on 201 and 202, both at 0, a "CLEAR" signal, a + pulse, on 203, forces outputs 101 and 102, of 214 and 216 to 0. Two 0 signals into 212 make its output a + into 214, holding 101 at 0 when the clear signal returns to 0. Two 0 signals into 218 make its output a + into 216, holding 102 at 0 when the clear signal returns to 0. Block 100 is as previously described, having inputs 101 and 102, and having its outputs 131 and 141 connected to output terminals 231 and 241 through transmission gates 230 and 240, which are controlled by inverters 260 and 270, which are, in turn, controlled by the presence or absence of an output signal on 131 or 141 through OR gate 250.

The logic element shown in FIG. 5 is one which can synthesize a condition which represents the temporal order of two non-contemporaneous, non-repetitive signals producing a corresponding 3-state output at terminals 231 and 241. When neither of the outputs 131 or 141 is +, OR gate 250 has 0 output which deactivates transmission gates 230 and 240 through the action of inverters 260 and 270. When transmission gates 230 and 240 are deactivated, outputs 231 and 241 are not connected to the respective terminals 131 and 141, and present a very high impedance, virtually open circuit, condition.

After having been cleared, with inputs 201 and 202 initially at 0, and having open circuited outputs 231 and 241, the operation is as follows: Say a first input pulse, "$A_2$", a +, appears on input terminal 201. A + on 201 drives the output of 212 to 0, and both inputs to 214 at 0 makes 101 a +, which is maintained after the signal on 201 returns to 0. Input signal "$A_2$" has thus been stored in the condition of the bistable storage element 212–214. Any subsequent signals, "$A_x$", will not alter the state of said storage element before another "CLEAR" signal. When a subsequent input pulse, "$B_2$", a +, appears on input 202, the output of 218 is driven to 0, and both inputs to 216 at 0, makes 102 a +. The condition of the bistable element 218–216, so set, will remain until cleared, as in the first case. The elements in block 100 act as previously described, wherein a first input condition, "A", on 101, followed by a subsequent input condition, "B", on 102, causes output 131 to become a +, while 141 remains at 0. 131, a +, into 250, makes its output a +, which, through OR gate 250 causes inverters 260 and 270 to enable transmission gates 230 and 240, causing outputs 231 and 241 to assume the conditions of 131, a +, and 141, a 0, respectively.

In a similar manner, starting from the initial, cleared condition for an input pulse "$B_2$" followed by a subsequent pulse, "$A_2$", output 231 will assume a 0 condition, while output 241 will assume a + condition. Thus in this embodiment of the said logic element, after having been cleared, each output 231 or 241 will be in a neutral state until the sequence "$A_2$, $B_2$", has been received; after which the outputs will assume their proper values as described, which condition will persist until the logic element is again cleared.

In any of the preceding embodiments, the outputs for the described logic elements are not defined for contemporaneous, i.e., simultaneous, input signals.

Other constraints are operative also, in addition to those already mentioned. For example, when dealing with the embodiments described, the difference in time between the inception of such signals should be large enough to allow the affected logic elements to respond properly. In the pulse-activated embodiments, a minimum pulse width is also a constraint, again dependent upon the particular implementation response, or gate delay.

In some applications, it may be advantageous to employ sequential logic elements for some or all of the storage means, and yet other embodiments could be described, but each would have the same basic characteristics: A logic element which will accept suitable non-contemporaneous, non-repetitive input signals, and will activate a unique output terminal corresponding to the temporal order, or sequence, of the input signals so presented.

A method of synthesizing, or representing, the temporal order of a pair of non-contemporaneous, non-repetitive signals has been demonstrated in the Figures and descriptions aforementioned. In each case, an input signal received by one input terminal, followed by a subsequent signal received by a different input terminal, has resulted in a particular output terminal activation. Each different sequence has resulted in a unique output terminal activation. The method of synthesizing a condition corresponding to the temporal order of one pair of input signals can be expanded to synthesize a condition corresponding to sequences of greater length.

Figure 6:
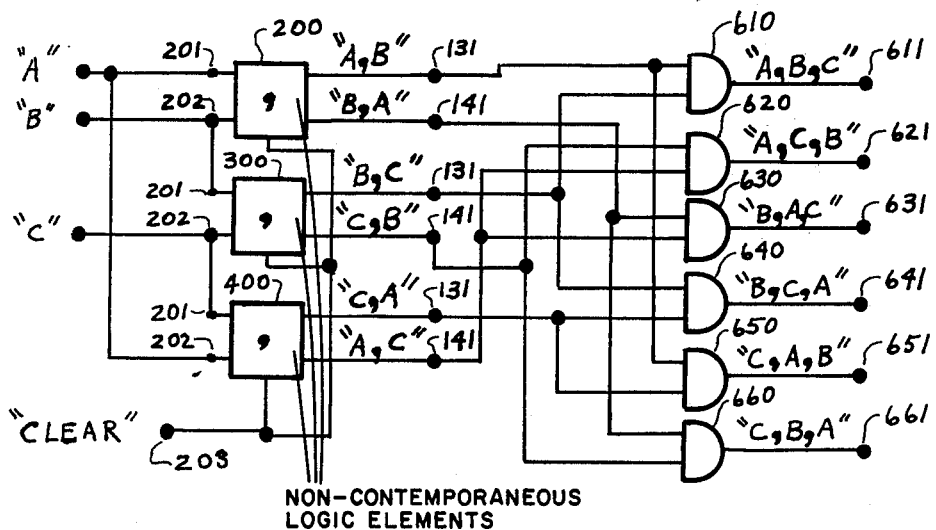
FIG. 6 is a diagram of an arrangement useful in practicing the invention.

In FIG. 6 are shown three logic elements, 200, 300 and 400, which are similar in all respects to the logic element shown in FIG. 4, and described previously. The input terminals 201 and 202 of said logic elements are connected in a particular arrangement to a source of non-contemporaneous, non-repetitive signals "A", "B", and "C"; and the outputs of those logic elements are connected in a particular arrangement to six AND gates: 610, 620, 630, 640, 650, and 660. The clear terminals are connected in common for the reception of "CLEAR" signals.

The ways in which 3 events, "A", "B", and "C", can occur non-contemporaneously and non-repetitively are 6 in number, or 3-factorial. Note that for 2 events, "A" and "B", the number of outputs, or sequences possible are 2 in number, or 2-factorial. This relationship holds for any number of events, and the possible ways a sequence of exactly n different members can be arranged is n-factorial. So for 3 inputs; "A", "B", and "C", there are 6 outputs in the scheme shown in FIG. 6. The 6 non-contemporaneous, non-repetitive ways in which the members "A", "B", and "C" can occur 3 at a time are: "A,B,C"; "A,C,B,"; "B,A,C"; "B,C,A"; "C,A,B"; and "C,B,A". The outputs 611, 621, 631, 641, 651, and 661 correspond to those unique sequences.

Suppose, after a clearing pulse, a +, has been presented to inputs 203 of logic elements 200, 300, and 400, the sequence "C,B,A" is received at input terminals 201 and 202. When the first input, "C", a + pulse, is received, it presents a + to 202 of 300, and a + to 201 of 400. From previous descriptions, we know that the outputs do not change at this point, but the input pulse, "C", has been registered in logic elements 300 and 400. The subsequent "B" pulse, a +, is presented to input terminals 202 of 200, and 201 of 300. Now, two input pulses have been received by logic element 300, one at each input. Having received a first input pulse, "C", on 202, and a subsequent input pulse, "B", on 201 of 300, its output 141 is activated, which presents input signals to 620 and 660. Additional requisite signals lacking, there is no activation of any final output terminal. When the subsequent + pulse "A", is presented, it makes 201 of 200 a +, and 202 of 400 a +.

Element 200, having received a first signal, "B", on 202, and a subsequent signal, "A", on 201, activates its output 141, presenting + inputs to 630 and 660. Element 400, having received a first signal, "C", on 201, and a subsequent signal, "A", on 202, activates its output 131, presenting input signals to 640 and 650. Thus, for the input sequence "C,B,A", logic gate 610 has received no input; logic gates 620, 630, 640, and 650 have received one input each; and logic gate 660 has received the two requisite inputs, which activate its output, 661. Therefore, for the input sequence "C,B,A", one, and only one, of the 6 possible outputs has been activated, namely 661. This output corresponds to one of the 6 non-contemporaneous, non-repetitive ways in which the sequence could occur, and in which it did occur.

For an input sequence, after clearing, of "B,C,A", output 131 of 300; output 141 of 200; and output 131 of 400 will all be activated. These activations provide gate 620 with no input signal; 610, 630, 650 and 660 with one input each; and gate 640 with two inputs, resulting in output 641 being activated. For each of the other possible input signal sequences, after clearing, the corresponding output will be activated.

For sequences of 4 members, the arrangement expands to 6 non-contemporaneous logic elements of the type described, with 24 3-input AND gates, and 24 unique outputs corresponding to the 24 possible sequences, i.e., for n=4, n-factorial=24.

For sequences of any length, the rule for the number of pair-synthesizing, non-contemporaneous logic elements necessary, is the number of pairs which can be constructed of n different elements, which is: $(n-1)+(n-2)+(n-3)+ \ldots +(1)$. This series is equal to: $n(n-1)/2$.

Figure 7:
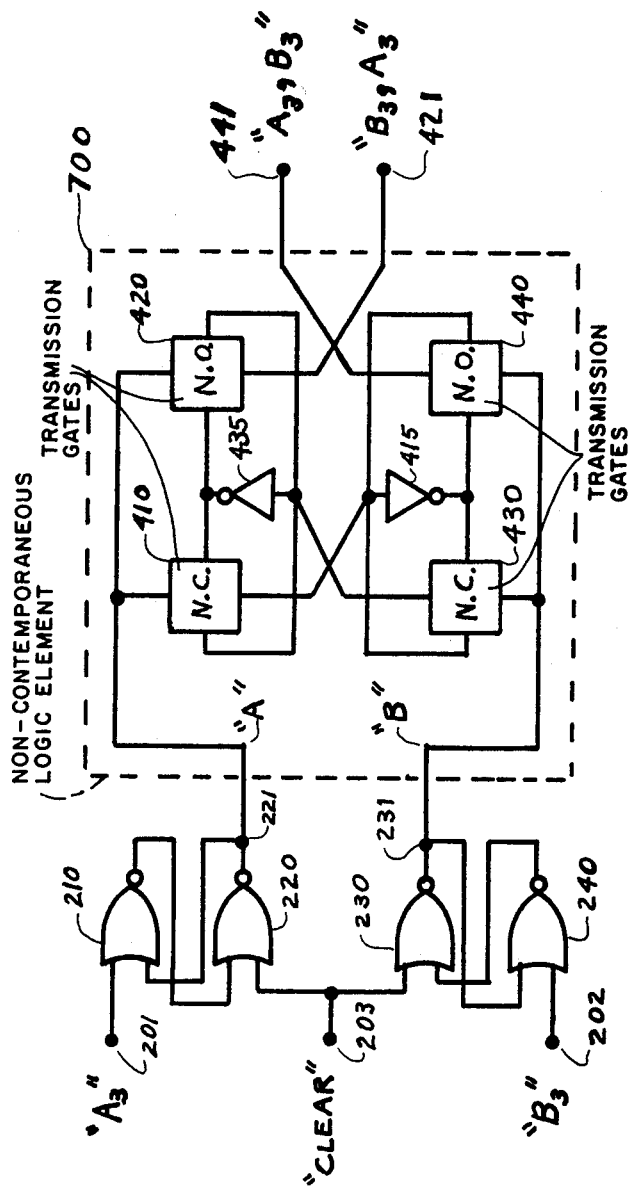
FIG. 7 is a schematic diagram of another embodiment of the invention.

FIG. 7 is an embodiment of a temporal comparator, i.e., non-contemporaneous logic element, similar to those already described, which is comprised of input terminals 201 and 202; clear terminal 203; NOR gates 210, 220, 230, and 240, comprising storage means with output terminals 221 and 231; transmission gates 410, 420, 430, and 440; inverters 415 and 435; output terminals 441 and 421; and interconnecting lines as shown.

A "CLEAR" pulse on terminal 203, with no input signal on 201 or 202, clears the storage means, forcing 221 and 231 to 0, which makes the outputs of gates 210 and 240 +, latching both storage means in that condition. Transmission gates 410 and 430 are normally closed, hence inverters 415 and 435 have 0 on their output lines, and + on their output terminals, which is the normal condition, holding 410 and 430 closed, and holding transmission gates 420 and 440 open. With 420 and 440 open, output terminals 441 and 421 show a high resistance or virtually open circuits.

Suppose now, that an input signal pulse, "B₃" is presented to input terminal 202. A + on 202 drives the output of 240 to 0. Two 0 inputs at 230 makes 231 a +, which holds 240 output at 0, latching the storage means 230–240, and holding output 231 at +. 231 at +, through normally closed 430, makes the input to inverter 435 a +, driving its output to 0. The reversal of conditions on 435 opens normally closed 410, and closes normally open 420. Even though 231 is +, 440 is open, so output 441 remains neutral. A subsequent input pulse, "A₃", a +, on 201 forces the output of 210 to 0, and both inputs to 220 at 0, make output 221 a +, which latches storage means 210–220 in that condition. 221, a +, finds 410 open and 420 closed, which presents a + output on 421, "B₃, A₃". Since the embodiment is, in all respects, bilaterally symmetrical, an "A₃" before "B₃", after a clear pulse, will produce a + output on 441, "A₃, B₃".

The portion of FIG. 7 enclosed in block 700 corresponds to block 100 in FIG. 3. The advantage of the arrangement of transmission gates and inverters in block 700 of FIG. 7, over the arrangement of inverters, NOR gates, and AND gates in block 100 of FIG. 3, is that the arrangement in 700 requires approximately one-half the number of components, and has a greatly reduced gate-delay.

Figure 8:
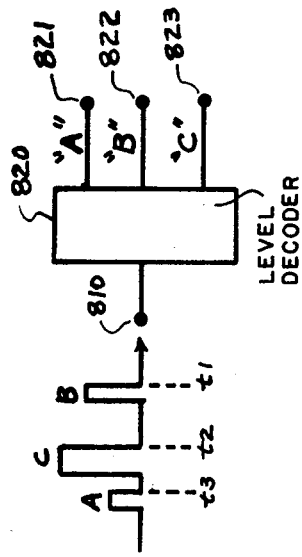
FIG. 8 is a diagram of a level decoder useful in practicing the invention.

In FIG. 8 is shown an arrangement whereby the diverse signals "A", "B", and "C" have been level encoded, and appear on a single input terminal 810, connected to a level decoder, 820. The level decoder 820 has output terminals 821, 822, and 823.

The signals on signal line 810 occur at successive times in the same location, but the dimension of level is present in the fact that "A", "B", and "C" levels can be differentiated or detected by the decoder 820, which may be such as a group of threshold detectors. The output of decoder 820 is the signal "B", at time 1 at one location, 822; "C", at time 2 at another location, 823; and "A", at time 3 at yet another location, 821. Those signals generate an output, "B,C,A" which, if applied to the corresponding inputs, 201 and 202 of FIG. 6, would produce the unique corresponding + output at terminal 641. Had that particular sequence been pre-selected, with no requirement for any other sequence, the preselection could have been implemented without logic element 300, or gates 610, 620, 630, 650, or 660.

What is claimed is:

1. A logic element which synthesizes a condition corresponding to the temporal order of the non-contemporaneous inception of a pair of maintained input signals consisting of two logic element input terminals; two pairs of transmission gates, each one of said transmission gates having one input terminal, one output terminal, and two control terminals; two inverters, each having an input terminal and an output terminal; and two logic element output terminals; and in which the control terminals of each said transmission gate in one of the said pairs of transmission gates are connected, one to each, to the input and output terminals of one of the said inverters; and in which the control terminals of each transmission gate in the other of the said pairs of transmission gates are connected, one to each, to the input and output terminals of the other of the said inverters, the said control terminal connections to the said inverter terminals being such that one of the said transmission gates in each said pair of transmission gates is normally open, and the other of the said transmission gates in each said pair of transmission gates is normally closed; and in which each of the said logic element input terminals is connected to the said input terminals of one each of the said pairs of transmission gates; and in which the output terminal of the said normally closed transmission gate in each said pair of transmission gates is connected to the input terminal of the inverter which is connected, as said, to the other pair of transmission gates; and in which the output terminal of the said normally open transmission gate in each said pair of transmission gates is connected to one each of the logic element output terminals; and in which the pair of maintained input signals occurring in one temporal order cause a particular one of the two logic element output terminals to be activated, and in which the pair of maintained input signals occurring in the reverse temporal order cause the other of the two logic element output terminals to be activated.

2. A logic element which synthesizes a condition which represents the temporal order of two different non-contemporaneous momentary input signals consisting of two logic element input terminals; two storage elements, each having two stable states, an input terminal for the reception of input signals, an output terminal which provides an output condition determined by the state of said storage element, and a CLEAR terminal for resetting the state and output condition of said storage element; two pairs of transmission gates, each one of said transmission gates having one input terminal, one output terminal and two control terminals; two inverters, each having an input terminal and an output terminal; and two logic element output terminals; and in which the control terminals of each said transmission gate in one of the said pairs of transmission gates are connected, one to each, to the input and output terminals of one of the said inverters; and in which the control terminals of each transmission gate in the other of the said pairs of transmission gates are connected, one to each, to the input and output terminals of the other of the said inverters, the said control terminal connections to the said inverter terminals being such that one of the said transmission gates in each said pair of transmission gates is normally open, and the other of the said transmission gates in each said pair of transmission gates is normally closed; and in which each of the said logic element input terminals is connected to the said input terminals of one each of the said pairs of transmission gates; and in which the output terminal of the said normally closed transmission gate in each said pair of transmission gates is connected to the input terminal of the inverter which is connected, as said, to the other pair of transmission gates; and in which the output terminal of the said normally open transmission gate in each said pair of transmission gates is connected to one each of the logic element output terminals; and in which the said momentary input signals occurring in one temporal order cause a particular one of the two logic element output terminals to be activated, and occurring in the reverse temporal order cause the other of the two logic element output terminals to be activated.

3. The logic element of claim 2 in which each of the two storage elements having one input terminal, one output terminal, and one CLEAR terminal consists of two NOR gates, each having two input and one output terminals, the two NOR gate output terminals each one being connected to one of the input terminals of the other said NOR gate, the storage element input terminal being connected to one of the remaining input terminals of one of the NOR gates, with the remaining input terminal of the other NOR gate being the CLEAR terminal for that storage element, and the output of the said storage element being the output terminal of that NOR gate in which the CLEAR terminal is an input terminal.

* * * * *